US006972882B2

(12) United States Patent
Ring et al.

(10) Patent No.: US 6,972,882 B2
(45) **Date of Patent: *Dec. 6, 2005**

(54) MICRO-MIRROR DEVICE WITH LIGHT ANGLE AMPLIFICATION

(75) Inventors: James W. Ring, Blodgett, OR (US); Brett E. Dahlgren, Lebanon, OR (US); Terry E. McMahon, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 42 days.

This patent is subject to a terminal disclaimer.

(21) Appl. No.: 10/387,310

(22) Filed: Mar. 12, 2003

(65) Prior Publication Data

US 2003/0202266 A1 Oct. 30, 2003

Related U.S. Application Data

(63) Continuation-in-part of application No. 10/136,719, filed on Apr. 30, 2002.

(51) Int. Cl.7 ...................... G02B 26/08
(52) U.S. Cl. ...................... 359/223; 359/871
(58) Field of Search ...................... 359/223–226, 359/390, 391, 871

(56) References Cited

U.S. PATENT DOCUMENTS

| | | | | |
|---|---|---|---|---|
| 4,359,698 | A | 11/1982 | Lambe et al. | |
| 4,662,746 | A | 5/1987 | Hornbeck | |
| 4,956,619 | A | 9/1990 | Hornbeck | |
| 5,061,049 | A | 10/1991 | Hornbeck | |
| 5,083,857 | A | 1/1992 | Hornbeck | |
| 5,486,936 | A | 1/1996 | Fujikake et al. | |
| 5,583,676 | A | 12/1996 | Akiyama et al. | |
| 5,583,688 | A | 12/1996 | Hornbeck | |
| 5,745,281 | A | 4/1998 | Yi et al. | |
| 5,959,338 | A | 9/1999 | Youngner et al. | |
| 6,025,951 | A | 2/2000 | Swart et al. | |
| 6,195,478 | B1 | 2/2001 | Fouquet | |
| 6,201,644 | B1 * | 3/2001 | Sakata et al. | 359/618 |
| 6,323,834 | B1 | 11/2001 | Colgan et al. | |
| 6,389,189 | B1 * | 5/2002 | Edwards et al. | 385/18 |
| 6,404,534 | B1 | 6/2002 | Chin et al. | |
| 6,404,942 | B1 | 6/2002 | Edwards et al. | |
| 6,714,105 | B2 * | 3/2004 | Eliacin et al. | 333/262 |
| 2001/0024556 | A1 | 9/2001 | Beguin et al. | |
| 2003/0012483 | A1 | 1/2003 | Ticknor et al. | |

FOREIGN PATENT DOCUMENTS

| | | |
|---|---|---|
| EP | 0916984 | 5/1999 |
| JP | 2001147385 | 5/2001 |
| WO | WO 0025160 | 5/2000 |
| WO | WO 0165292 | 9/2001 |

(Continued)

OTHER PUBLICATIONS

Michael Pycraft Huges, "AC Bectrokinetics: Applications for Nanotechnology", Seventh Foresight Conference on Molecular Nanotechnology, Nov. 30, 1999, pp. 1-16, retrieved from the Internet: [http://www.Foresight.org/Conferences/MNT7/Papers/Hughes/].

(Continued)

*Primary Examiner*—Joshua L. Pritchett

(57) ABSTRACT

A micro-mirror device includes a substrate and a plate spaced from and oriented substantially parallel to the substrate such that the plate and the substrate define a cavity therebetween. A reflective element is interposed between the substrate and the plate, and a liquid having an index of refraction greater than one is disposed in the cavity between at least the reflective element and the plate. As such, the reflective element is adapted to move between a first position and at least one second position.

50 Claims, 8 Drawing Sheets

FOREIGN PATENT DOCUMENTS

| | | |
|---|---|---|
| WO | WO 02/010836 | 2/2002 |
| WO | WO 02/088527 | 12/2002 |

OTHER PUBLICATIONS

A. Feinerman et al., "Fast Micro-Mirrors With Large Angle Deflections", 25 pgs., retrieved from the Internet: [http://www.darpa.mil/mto/stab/kickoff/slb_vic.pdf].

Alexander Wolter, "Studi s on a High-Resolution Spatial Light Modulator with Deformable Surfac Profile of a Liquid Film for Optical Pattern Generation", Jan. 24, 2001, pp. 1-2, Abstract only.

Alexander Wolter et al., "Fabrication of the Moving Liquid Mirror (MLM) Spatial Light Modulator in a Standard CMOS-Process", SPIE vol. 4178 (2000), pp. 246-254.

Alexander Wolter et al., "The Moving Liquid Mirror (MLM) Spatial Light Modulator: Simulation and Measurement of the Optical Performance", MEMS-vol. 2, Micro-Electro-Mechanical Systems (MEMS)(2000). pp. 437-442.

H. Togo et al., "Multi-Element Th rmo-Capillary Optical Switch and Sub-Nanoliter Oil Injection for its Fabrication", 1999 IEEE, pp. 418-423.

Junghoon Lee et al., "Surface Tension Driven Microactuation Based on Continuous Electrow etting (CEW)", pp. 1-25, retrieved from the Internet: [http://cjmems.seas.ucla.edu/papers/Junghoon_jmem_2000_text.pdf] and Figures 1-14, retrieved from the Internet: [http://cjmems.seas.ucla.edu/papers/Junghoon_jmem_2000_figure.pdf].

Chang-Jin "CJ" Kim, "Mems Devices Based on the Use of Surface Tension", 4 pgs., retrieved from the Internet: [http://cjmems.seas.ucla.edu/papers/CJ_ISDRS_99.pdf].

Chang-Jin Kim, " Microfluids Using the Surface Tension Force in Micr scal ", Aug. 2000, Proc. SPIE vol. 4177, Abstract only.

Copy of European Search Report having Application No. 03252590, mailed on Aug. 24, 2004.

* cited by examiner

MICRO-MIRROR DEVICE WITH LIGHT ANGLE AMPLIFICATION

CROSS-REFERENCE TO RELATED APPLICATIONS

This application is a Continuation-In-Part of copending U.S. patent application Ser. No. 10/136,719, filed on Apr. 30, 2002, assigned to the assignee of the present invention, and incorporated herein by reference.

THE FIELD OF THE INVENTION

The present invention relates generally to micro-actuators, and more particularly to a micro-mirror device.

BACKGROUND OF THE INVENTION

Micro-actuators have been formed on insulators or other substrates using micro-electronic techniques such as photolithography, vapor deposition, and etching. Such micro-actuators are often referred to as micro-electromechanical systems (MEMS) devices. An example of a micro-actuator includes a micro-mirror device. The micro-mirror device can be operated as a light modulator for amplitude and/or phase modulation of incident light. One application of a micro-mirror device is in a display system. As such, multiple micro-mirror devices are arranged in an array such that each micro-mirror device provides one cell or pixel of the display.

A conventional micro-mirror device includes an electrostatically actuated mirror supported for rotation about an axis of the mirror. As such, rotation of the mirror about the axis may be used to modulate incident light by directing or reflecting the incident light in different directions. To effectively direct the incident light in different directions, the angle of the reflected light must be sufficient. The angle of the reflected light may be increased, for example, by increasing the angle of rotation or tilt of the mirror. Increasing the angle of rotation or tilt of the mirror, however, may fatigue the mirror and/or produce slower response times since the mirror will be rotated or tilted over a larger distance.

Accordingly, it is desired to effectively increase an angle of reflected light from the micro-mirror device without having to increase rotation or tilt of the mirror of the micro-mirror device.

SUMMARY OF THE INVENTION

One aspect of the present invention provides a micro-mirror device. The micro-mirror device includes a substrate and a plate spaced from and oriented substantially parallel to the substrate such that the plate and the substrate define a cavity therebetween. A reflective element is interposed between the substrate and the plate, and a liquid having an index of refraction greater than one is disposed in the cavity between at least the reflective element and the plate. As such, the reflective element is adapted to move between a first position and at least one second position.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
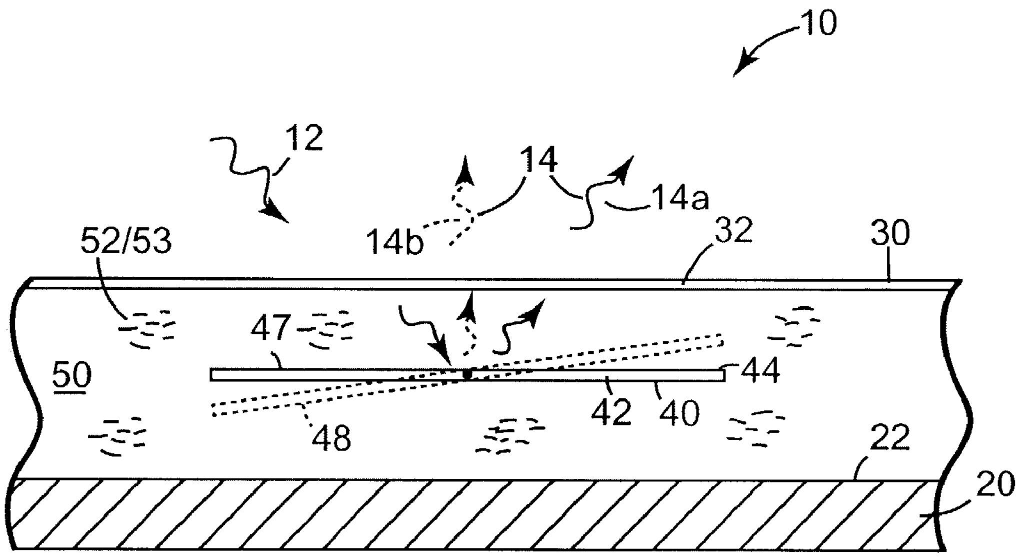
FIG. 1 is a schematic cross-sectional view illustrating one embodiment of a portion of a micro-mirror device according to the present invention.

FIG. 1 illustrates one embodiment of a micro-mirror device 10. Micro-mirror device 10 is a micro-actuator which relies on electrical to mechanical conversion to generate a force and cause movement or actuation of a body or element. In one embodiment, as described below, a plurality of micro-mirror devices 10 are arranged to form an array of micro-mirror devices. As such, the array of micro-mirror devices may be used to form a display. As such, each micro-mirror device 10 constitutes a light modulator for modulation of incident light and provides one cell or pixel of the display. In addition, micro-mirror device 10 may also be used in other imaging systems such as projectors or printers, and may also be used for optical addressing or switching, and/or other optical beam modification.

In one embodiment, micro-mirror device 10 includes a substrate 20, a plate 30, and an actuating element 40. Preferably, plate 30 is oriented substantially parallel to a surface 22 of substrate 20 and spaced from surface 22 so as to define a cavity 50 therebetween. Actuating element 40 is interposed between surface 22 of substrate 20 and plate 30. As such, actuating element 40 is positioned within cavity 50.

In one embodiment, actuating element 40 is actuated so as to move between a first position 47 and a second position 48 relative to substrate 20 and plate 30. Preferably, actuating element 40 moves or tilts at an angle about an axis of rotation. As such, first position 47 of actuating element 40 is illustrated as being substantially horizontal and substantially parallel to substrate 20 and second position 48 of actuating element 40 is illustrated as being oriented at an angle to first position 47. Movement or actuation of actuating element 40 relative to substrate 20 and plate 30 is described in detail below.

In one embodiment, cavity 50 is filled with a liquid 52 such that actuating element 40 is in contact with liquid 52. More specifically, regardless of the orientation of micro-mirror device 10, cavity 50 is filled with liquid 52 such that liquid 52 is disposed between at least actuating element 40 and plate 30. In one embodiment, cavity 50 is filled with liquid 52 such that actuating element 40 is submerged in liquid 52. Liquid 52, therefore, is disposed between actuating element 40 and substrate 20 and between actuating element 40 and plate 30. Thus, liquid 52 contacts or wets opposite surfaces of actuating element 40.

Preferably, liquid 52 is transparent. As such, liquid 52 is clear or colorless in the visible spectrum. In addition, liquid 52 is chemically stable in electric fields, thermally stable with a wide temperature operating range, and photochemically stable. In addition, liquid 52 has a low vapor pressure and is non-corrosive.

In one embodiment, liquid 52 includes a dielectric liquid 53. Dielectric liquid 53 enhances actuation of actuating element 40, as described below. Preferably, dielectric liquid 53 has a high polarizability in electric fields and moves in a non-uniform electric field. In addition, dielectric liquid 53 has a low dielectric constant and a high dipole moment. In addition, dielectric liquid 53 is generally flexible and has pi electrons available. Examples of liquids suitable for use as dielectric liquid 53 include phenyl-ethers, either alone or in blends (i.e., 2, 3, and 5 ring), phenyl-sulphides, and/or phenyl-selenides. In one illustrative embodiment, examples of liquids suitable for use as dielectric liquid 53 include a polyphenyl ether (PPE) such as OS138 and olive oil.

Preferably, plate 30 is a transparent plate 32 and actuating element 40 is a reflective element 42. In one embodiment, transparent plate 32 is a glass plate. Other suitable planar translucent or transparent materials, however, may be used. Examples of such a material include quartz and plastic.

Reflective element 42 includes a reflective surface 44. In one embodiment, reflective element 42 is formed of a uniform material having a suitable reflectivity to form reflective surface 44. Examples of such a material include polysilicon or a metal such as aluminum. In another embodiment, reflective element 42 is formed of a base material such as polysilicon with a reflective material such as aluminum or titanium nitride disposed on the base material to form reflective surface 44. In addition, reflective element 42 may be formed of a non-conductive material or may be formed of or include a conductive material.

As illustrated in the embodiment of FIG. 1, micro-mirror device 10 modulates light generated by a light source (not shown) located on a side of transparent plate 32 opposite of substrate 20. The light source may include, for example, ambient and/or artificial light. As such, input light 12, incident on transparent plate 32, passes through transparent plate 32 into cavity 50 and is reflected by reflective surface 44 of reflective element 42 as output light 14. Thus, output light 14 passes out of cavity 50 and back through transparent plate 32.

The direction of output light 14 is determined or controlled by the position of reflective element 42. For example, with reflective element 42 in first position 47, output light 14 is directed in a first direction **14*a*. However, with reflective element 42 in second position 48, output light 14 is directed in a second direction 14*b*. Thus, micro-mirror device 10 modulates or varies the direction of output light 14 generated by input light 12. As such, reflective element 42** can be used to steer light into, and/or away from, an optical imaging system.

In one embodiment, first position 47 is a neutral position of reflective element 42 and represents an "ON" state of micro-mirror device 10 in that light is reflected, for example, to a viewer or onto a display screen, as described below. Thus, second position 48 is an actuated position of reflective element 42 and represents an "OFF" state of micro-mirror device 10 in that light is not reflected, for example, to a viewer or onto a display screen.

Figure 2:
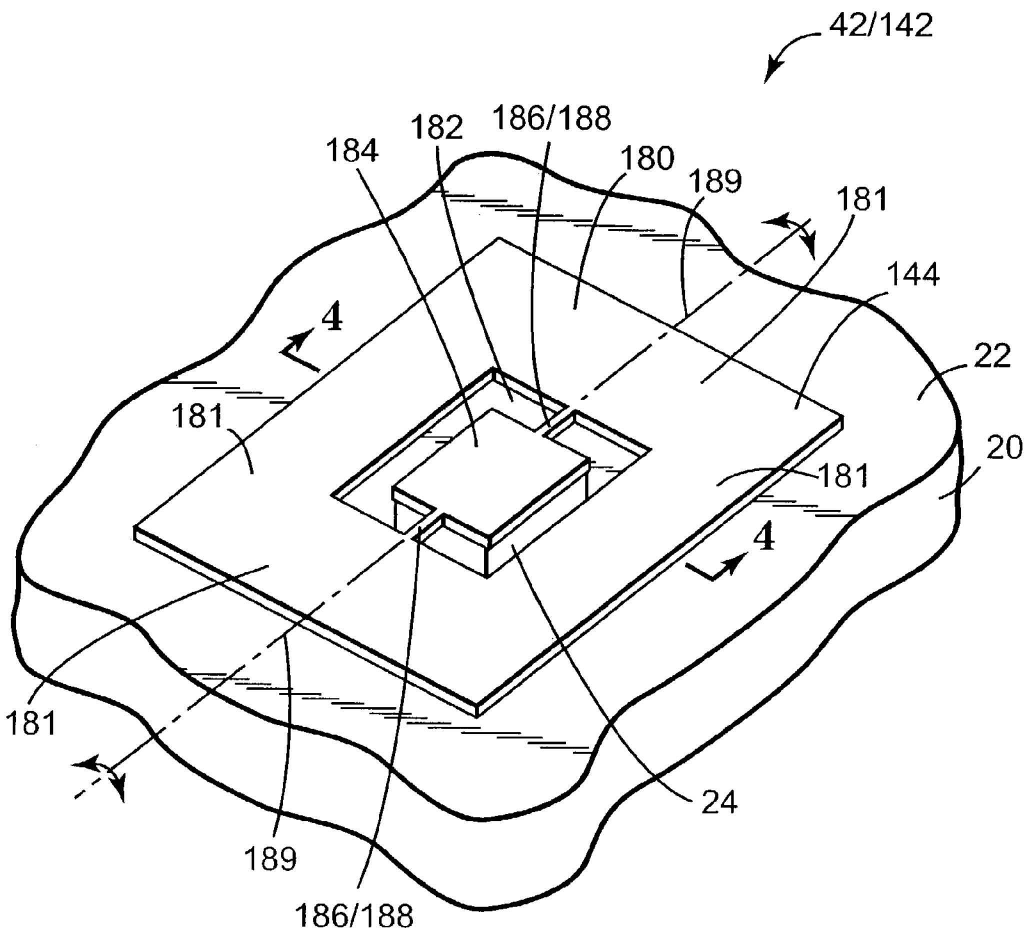
FIG. 2 is a perspective view illustrating one embodiment of a portion of a micro-mirror device according to the present invention.

FIG. 2 illustrates one embodiment of reflective element 42. Reflective element 142 has a reflective surface 144 and includes a substantially rectangular-shaped outer portion 180 and a substantially rectangular-shaped inner portion 184. In one embodiment, reflective surface 144 is formed on both outer portion 180 and inner portion 184. Outer portion 180 has four contiguous side portions 181 arranged to form a substantially rectangular-shaped opening 182. As such, inner portion 184 is positioned within opening 182. Preferably, inner portion 184 is positioned symmetrically within opening 182.

In one embodiment, a pair of hinges 186 extend between inner portion 184 and outer portion 180. Hinges 186 extend from opposite sides or edges of inner portion 184 to adjacent opposite sides or edges of outer portion 180. Preferably, outer portion 180 is supported by hinges 186 along an axis of symmetry. More specifically, outer portion 180 is supported about an axis that extends through the middle of opposed edges thereof. As such, hinges 186 facilitate movement of reflective element 142 between first position 47 and second position 48, as described above (FIG. 1). More specifically, hinges 186 facilitate movement of outer portion 180 between first position 47 and second position 48 relative to inner portion 184.

In one embodiment, hinges 186 include torsional members 188 having longitudinal axes 189 oriented substantially parallel to reflective surface 144. Longitudinal axes 189 are collinear and coincide with an axis of symmetry of reflective element 142. As such, torsional members 188 twist or turn about longitudinal axes 189 to accommodate movement of outer portion 180 between first position 47 and second position 48 relative to inner portion 184.

In one embodiment, reflective element 142 is supported relative to substrate 20 by a support or post 24 extending from surface 22 of substrate 20. More specifically, post 24 supports inner portion 184 of reflective element 142. As such, post 24 is positioned within side portions 181 of outer portion 180. Thus, outer portion 180 of reflective element 142 is supported from post 24 by hinges 186.

Figure 3:
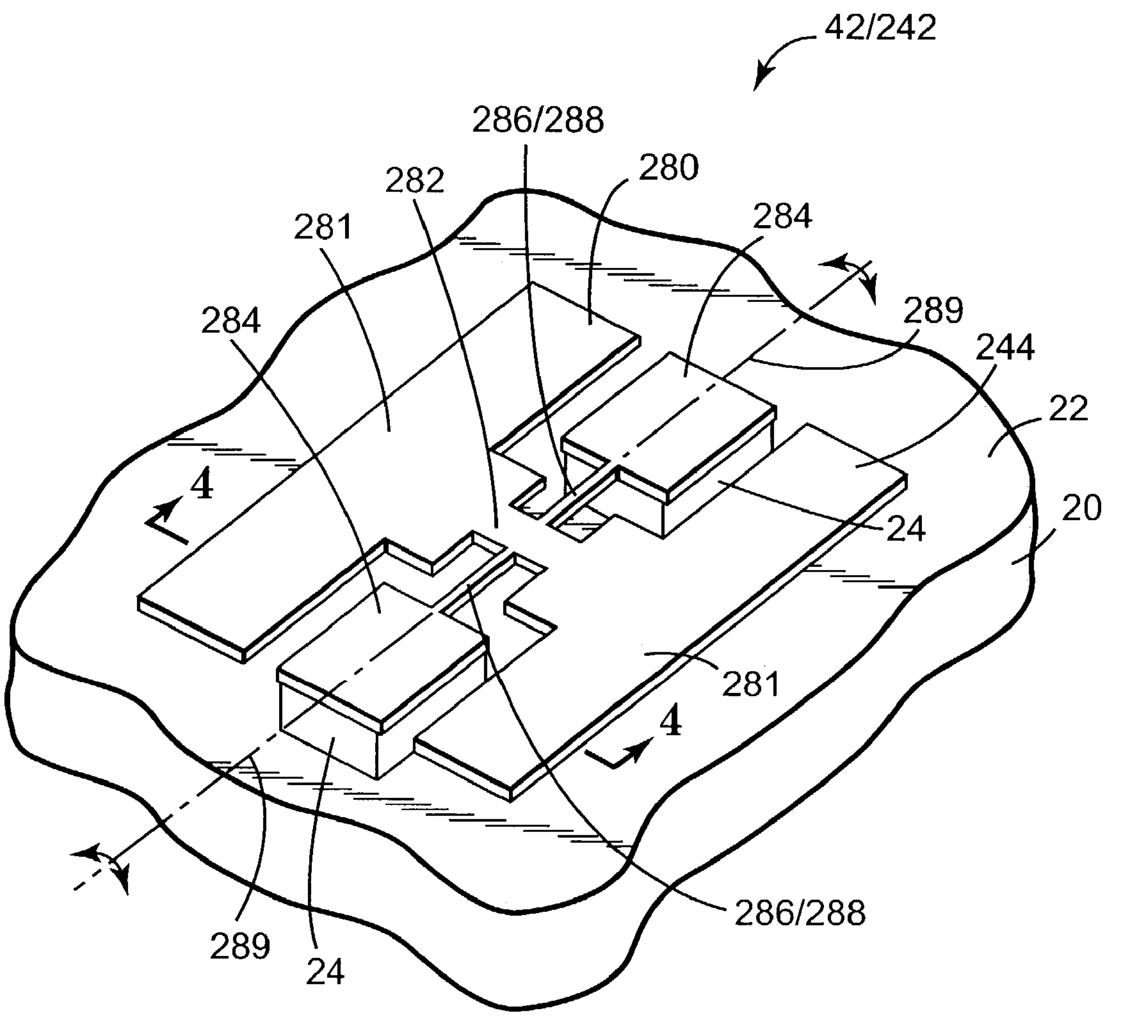
FIG. 3 is a perspective view illustrating another embodiment of a portion of a micro-mirror device according to the present invention.

FIG. 3 illustrates another embodiment of reflective element 42. Reflective element 242 has a reflective surface 244 and includes a substantially H-shaped portion 280 and a pair of substantially rectangular-shaped portions 284. In one embodiment, reflective surface 244 is formed on both H-shaped portion 280 and rectangular-shaped portions 284. H-shaped portion 280 has a pair of spaced leg portions 281 and a connecting portion 282 extending between spaced leg portions 281. As such, rectangular-shaped portions 284 are positioned on opposite sides of connection portion 282 between spaced leg portions 281. Preferably, rectangular-shaped portions 284 are positioned symmetrically to spaced leg portions 281 and connecting portion 282.

In one embodiment, hinges 286 extend between rectangular-shaped portions 284 and H-shaped portion 280. Hinges 286 extend from a side or edge of rectangular-shaped portions 284 to adjacent opposite sides or edges of connecting portion 282 of H-shaped portion 280. Preferably, H-shaped portion 280 is supported by hinges 286 along an axis of symmetry. More specifically, H-shaped portion 280 is supported about an axis that extends through the middle of opposed edges of connecting portion 282. As such, hinges 286 facilitate movement of reflective element 242 between first position 47 and second position 48, as described above (FIG. 1). More specifically, hinges 286 facilitate movement of H-shaped portion 280 between first position 47 and second position 48 relative to rectangular-shaped portions 284.

In one embodiment, hinges 286 include torsional members 288 having longitudinal axes 289 oriented substantially parallel to reflective surface 244. Longitudinal axes 289 are collinear and coincide with an axis of symmetry of reflective element 242. As such, torsional members 288 twist or turn about longitudinal axes 289 to accommodate movement of H-shaped portion 280 between first position 47 and second position 48 relative to rectangular-shaped portions 284.

In one embodiment, reflective element 242 is supported relative to substrate 20 by a pair of posts 24 extending from surface 22 of substrate 20. More specifically, posts 24 support rectangular-shaped portions 284 of reflective element 242. As such, posts 24 are positioned on opposite sides of connecting portion 282 between spaced leg portions 281. Thus, H-shaped portion 280 of reflective element 242 is supported from posts 24 by hinges 286.

Figure 4:
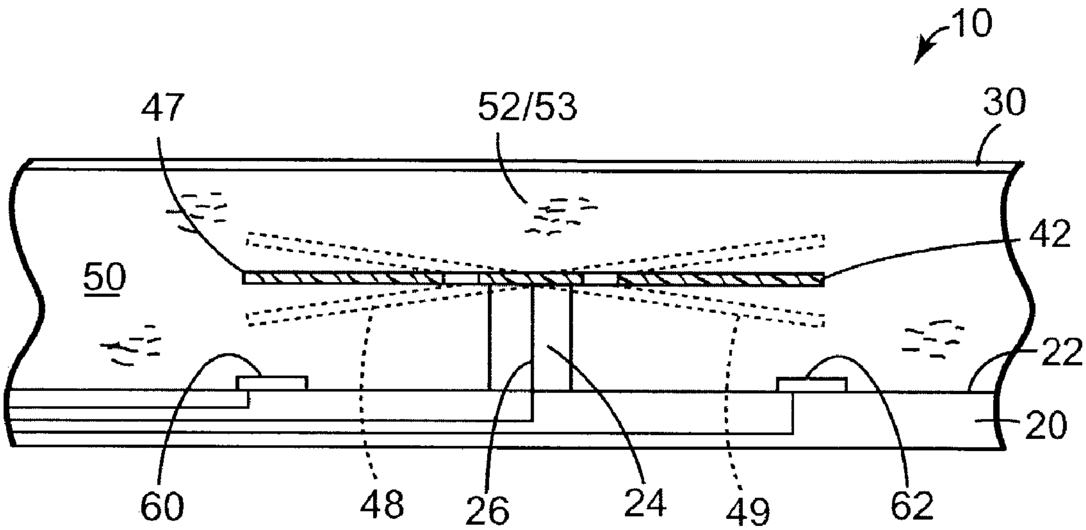
FIG. 4 is a schematic cross-sectional view taken along line 4—4 of FIGS. 2 and 3 illustrating one embodiment of actuation of a micro-mirror device according to the present invention.

FIG. 4 illustrates one embodiment of actuation of micro-mirror device 10. In one embodiment, reflective element 42 (including reflective elements 142 and 242) is moved between first position 47 and second position 48 by applying an electrical signal to an electrode 60 formed on substrate 20. In one embodiment, electrode 60 is formed on surface 22 of substrate 20 adjacent an end or edge of reflective element 42. Application of an electrical signal to electrode 60 generates an electric field between electrode 60 and reflective element 42 which causes movement of reflective element 42 between first position 47 and second position 48. As such, reflective element 42 is moved in a first direction.

Preferably, dielectric liquid 53 is selected so as to respond to the electric field. More specifically, dielectric liquid 53 is selected such that the electric field aligns and moves polar molecules of the liquid. As such, dielectric liquid 53 moves in the electric field and contributes to the movement of reflective element 42 between first position 47 and second position 48 upon application of the electrical signal. Thus, with dielectric liquid 53 in cavity 50, dielectric liquid 53 enhances an actuation force acting on reflective element 42 as described, for example, in related U.S. patent application Ser. No. 10/136,719, assigned to the assignee of the present invention.

Preferably, when the electrical signal is removed from electrode 60, reflective element 42 persists or holds second position 48 for some length of time. Thereafter, restoring forces of reflective element 42 including, for example, hinges 186 (FIG. 2) and hinges 286 (FIG. 3) pull or return reflective element 42 to first position 47.

In one embodiment, a conductive via 26 is formed in and extends through post 24. Conductive via 26 is electrically coupled to reflective element 42 and, more specifically, conductive material of reflective element 42. As such, reflective element 42 (including reflective elements 142 and 242) is moved between first position 47 and second position 48 by applying an electrical signal to electrode 60 and reflective element 42. More specifically, electrode 60 is energized to one electrical potential and the conductive material of reflective element 42 is energized to a different electrical potential.

Application of one electrical potential to electrode 60 and a different electrical potential to reflective element 42 generates an electric field between electrode 60 and reflective element 42 which causes movement of reflective element 42 between first position 47 and second position 48. Dielectric liquid 53 contributes to the movement of reflective element 42, as described above.

In another embodiment, reflective element 42 (including reflective elements 142 and 242) is moved between first position 47 and second position 48 by applying an electrical signal to reflective element 42. More specifically, the electrical signal is applied to conductive material of reflective element 42 by way of conductive via 26 through post 24. As such, application of an electrical signal to reflective element 42 generates an electric field which causes movement of reflective element 42 between first position 47 and second position 48. Dielectric liquid 53 contributes to the movement of reflective element 42, as described above.

Additional embodiments of actuation of micro-mirror device 10 are described, for example, in related U.S. patent application Ser. No. 10/136,719, assigned to the assignee of the present invention.

In one embodiment, as illustrated in FIG. 4, reflective element 42 is also moved in a second direction opposite the first direction. More specifically, reflective element 42 is moved between first position 47 and a third position 49 oriented at an angle to first position 47 by applying an electrical signal to an electrode 62 formed on substrate 20 adjacent an opposite end or edge of reflective element 42. As such, reflective element 42 is moved in the second direction opposite the first direction by application of an electrical signal to electrode 62.

Application of the electrical signal to electrode 62 generates an electric field between electrode 62 and reflective element 42 which causes movement of reflective element 42 between first position 47 and third position 49 in a manner similar to how reflective element 42 moves between first position 47 and second position 48, as described above. It is also within the scope of the present invention for reflective element 42 to move directly between second position 48 and third position 49 without stopping or pausing at first position 47.

In one embodiment, liquid 52 (including dielectric liquid 53) contained within cavity 50 of micro-mirror device 10 has an index of refraction greater than one. In addition, air which surrounds micro-mirror device 10 has an index of refraction which is substantially one. As such, regions having different indexes of refraction are formed within cavity 50 of micro-mirror device 10 and outside of cavity 50 of micro-mirror device 10.

Because of the different indexes of refraction, a light ray modulated by micro-mirror device 10 undergoes refraction at the interface between the two regions. More specifically, input light which passes through plate 30 and into cavity 50 undergoes refraction at the interface with cavity 50. In addition, output light which is reflected by reflective element 42 and from cavity 50 through plate 30 undergoes refraction at the interface with cavity 50. In one embodiment, a material of plate 30 is selected so as to have an index of refraction substantially equal to that of liquid 52. In addition, a thickness of plate 30 is substantially thin such that refraction at plate 30 is negligible. In one exemplary embodiment, the thickness of plate 30 is approximately one millimeter.

In one illustrative embodiment, the index of refraction of liquid 52 contained within cavity 50 of micro-mirror device 10 is in a range of approximately 1.3 to approximately 1.7. Examples of liquids suitable for use as liquid 52 include diphenyl ether, diphenyl ethylene, polydimetbyl siloxane, or tetraphenyl-tetramethyL-trisiloxane. These and other liquids suitable for use as liquid 52 are described, for example, in U.S. patent application Ser. No. 10/387,245, and U.S. patent application Ser. No. 10/387,312, both filed on even date herewith, assigned to the assignee of the present invention, and incorporated herein by reference.

Figure 5:
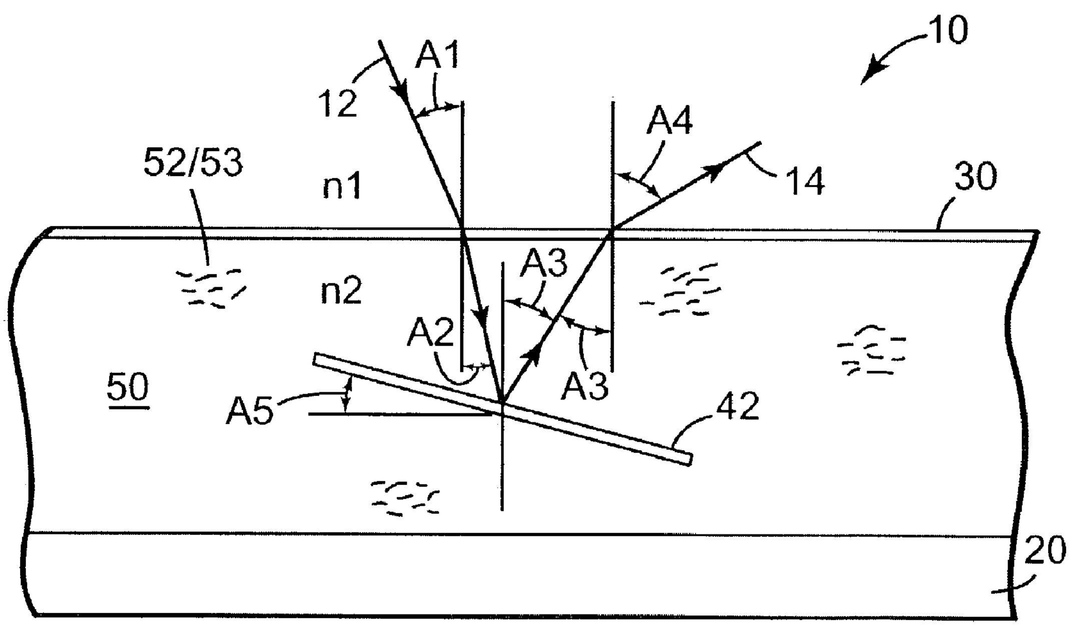
FIG. 5 is a schematic cross-sectional view illustrating one embodiment of light modulation by a micro-mirror device according to the present invention.

Referring to FIG. 5, for a light ray intersecting a plane surface interface, Snell's Law holds that:

$$n1\,\sin(A1)=n2\,\sin(A2)$$

where n1 represents the index of refraction on a first side of the plane surface interface, A1 represents the included angle formed on the first side of the plane surface interface between the light ray and a line perpendicular to the plane surface interface through a point where the light ray intersects the plane surface interface, n2 represents the index of refraction on a second side of the plane surface interface, and A2 represents the included angle formed on the second side of the plane surface interface between the light ray and the line perpendicular to the plane surface interface through the point where the light ray intersects the plane surface interface.

FIG. 5 illustrates one embodiment of input light 12 passing through plate 30 into cavity 50 and being reflected as output light 14 from cavity 50 back through plate 30. In one embodiment, as described above, liquid 52 within cavity 50 has an index of refraction greater than one and, more specifically, greater than the air outside of cavity 50. As such, input light 12 undergoes refraction at the interface with cavity 50 as input light 12 enters cavity 50 and output light 14 undergoes refraction at the interface with cavity 50 as output light 14 leaves cavity 50.

In one embodiment, an angle A1 is formed outside of cavity 50 between input light 12 and a line extended perpendicular to an interface with cavity 50 through a point where input light 12 intersects the interface. Angle A1, therefore, represents an illumination angle of input light 12. In addition, an angle A2 is formed within cavity 50 between input light 12 and the line extended perpendicular to the interface with cavity 50 through the point where input light 12 intersects the interface. Angle A2, therefore, represents an illumination refraction angle of input light 12.

As described above, input light 12 is reflected as output light 14 by reflective element 42. As such, an angle A3 is formed within cavity 50 between output light 14 and a line extended parallel to the line extended perpendicular to the interface with cavity 50 through the point where input light 12 intersects the interface through a point where input light 12 is reflected by reflective element 42. Angle A3, therefore, represents a reflection angle of output light 14. In addition, an angle A4 is formed outside of cavity 50 between output light 14 and a line extended perpendicular to an interface with cavity 50 through a point where output light 14 intersects the interface. Angle A4, therefore, represents an exit angle of output light 14.

By applying optics fundamentals, including refraction at the interface with cavity 50 and reflection at reflective element 42, exit angle A4 can be derived for varying tilt angles of reflective element 42, represented by angle A5, and differing indexes of refraction of liquid 52 within cavity 50, represented by index of refraction n2. As described above, the index of refraction of air surrounding micro-mirror device 10, represented by index of refraction n1, is substantially one.

Figure 6:
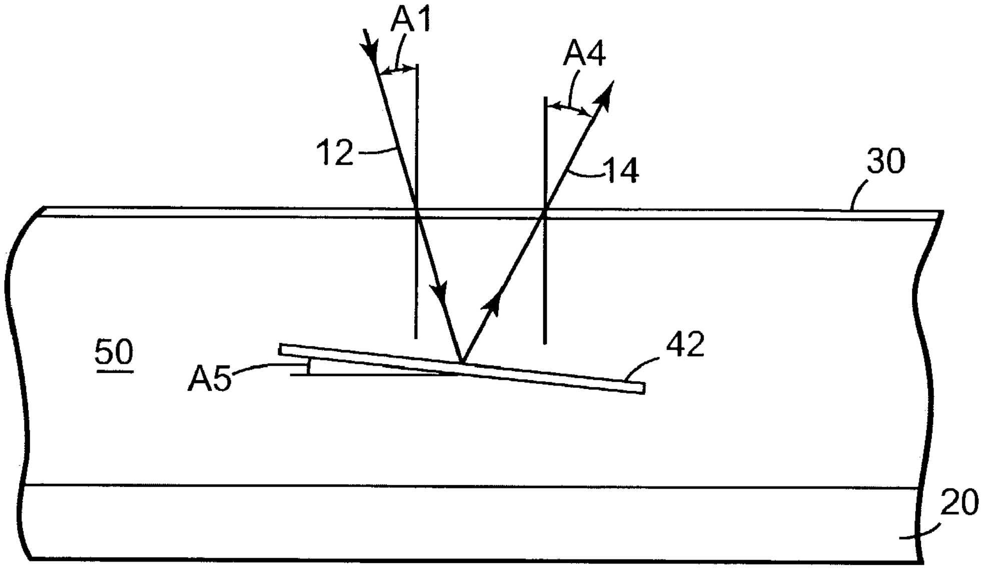
FIG. 6 is a schematic cross-sectional view illustrating one embodiment of light modulation by a conventional micro-mirror device.
Figure 7:
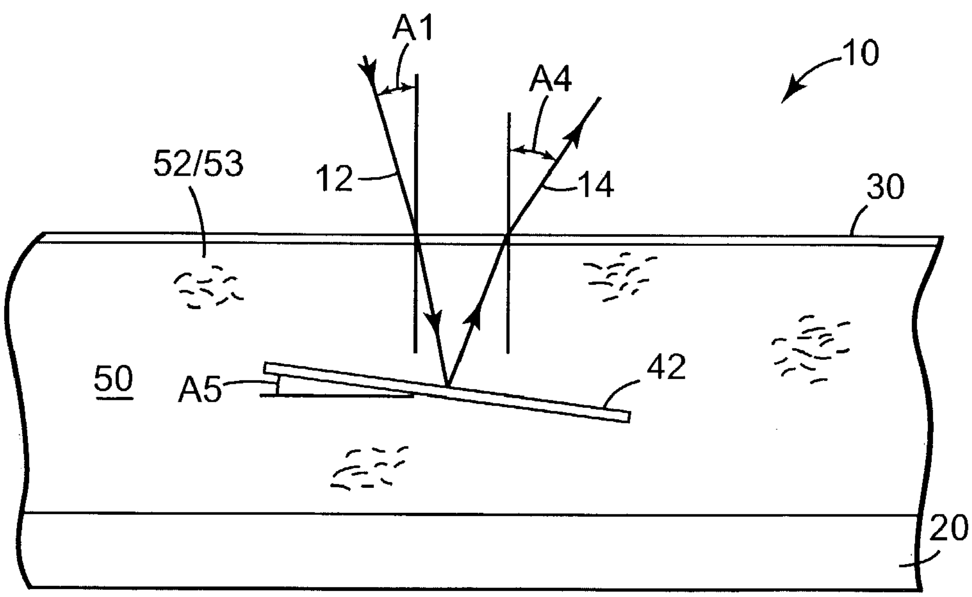
FIG. 7 is a schematic cross-sectional view illustrating another embodiment of light modulation by a micro-mirror device according to the present invention.

FIGS. 6 and 7 illustrate one exemplary embodiment of modulation of light by a micro-mirror device without and with, respectively, a liquid having an index of refraction greater than one disposed within cavity 50. FIG. 6 illustrates modulation of light by a micro-mirror device without a liquid having an index of refraction greater than one disposed within cavity 50. In the exemplary embodiment of FIG. 6, cavity 50 does not include liquid 52 but, rather, includes air. As such, the index of refraction within cavity 50 is substantially one. Since the index of refraction outside of the micro-mirror device is also substantially one, refraction does not occur at the interface with cavity 50 assuming that a thickness of plate 30 is substantially thin, as described above. In the exemplary embodiment of FIG. 6, illumination angle A1 of input light 12 is 15 degrees and tilt angle A5 of reflective element 42 is 5 degrees. As such, exit angle A4 of output light 14 is 25 degrees.

FIG. 7 illustrates modulation of light by a micro-mirror device with a liquid having an index of refraction greater than one disposed within cavity 50. In the exemplary embodiment of FIG. 7, cavity 50 includes liquid 52 (including dielectric liquid 53) having an index of refraction of 1.65. In addition, for comparison with FIG. 6, illumination angle A1 of input light 12 is 15 degrees and tilt angle A5 of reflective element 42 is 5 degrees. Exit angle A4 of output light 14, however, is 32.5 degrees. As such, with the same illumination angle (15 degrees) of input light 12 and the same tilt angle (5 degrees) of reflective element 42, a larger exit angle for output light 14 can be achieved with liquid 52 disposed within cavity 50. Thus, for example, a 30 percent increase (7.5 degrees) in the exit angle of output light 14 from cavity 50 can be achieved without an increase in the tilt angle of reflective element 42 when cavity 50 includes liquid 52. This increase in exit angle is referred to herein as angle magnification.

Figure 8:
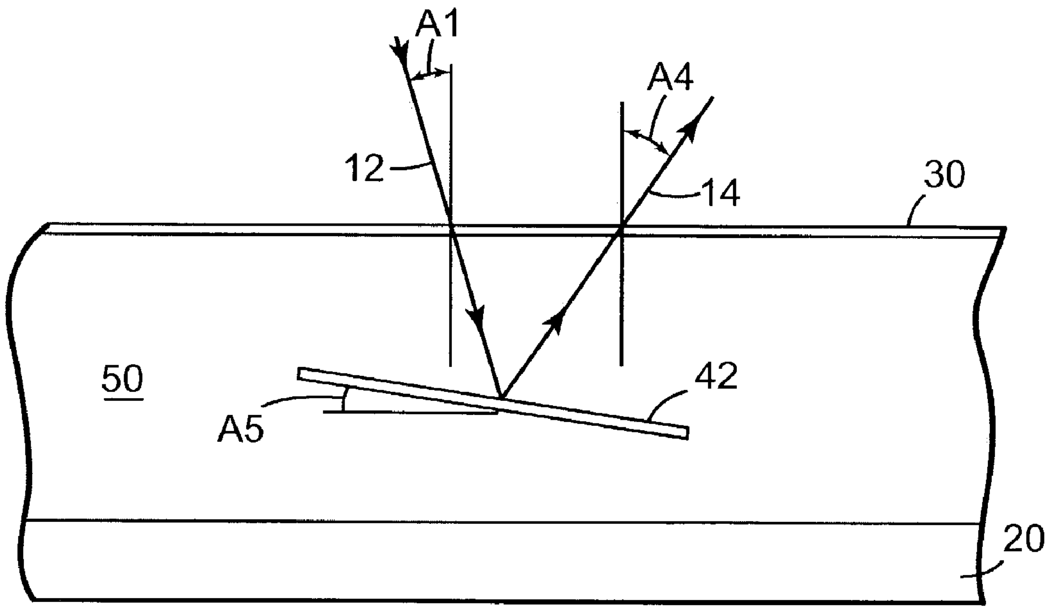
FIG. 8 is a schematic cross-sectional view illustrating another embodiment of light modulation by a conventional micro-mirror device.

FIG. 8 illustrates another exemplary embodiment of modulation of light by a micro-mirror device without a liquid having an index of refraction greater than one disposed within cavity 50. In the exemplary embodiment of FIG. 8, cavity 50 does not include liquid 52 but, rather, includes air. The index of refraction within cavity 50, therefore, is substantially one. Since the index of refraction outside of the micro-mirror device is also substantially one, angle magnification does not occur at the interface with cavity 50.

In the exemplary embodiment of FIG. 8, illumination Angle A1 of input light 12 is 15 degrees and tilt angle A5 of reflective element 42 is 5 degrees. As such, without liquid 52 disposed within cavity 50 and with the same illumination angle (15 degrees) of input light 12, to produce exit angle A4 of output light 14 with the same exit angle (32.5 degrees) as illustrated in FIG. 7, tilt angle A5 of reflective element 42 must be increased to 8.75 degrees. Thus, for example, a 75 percent increase (3.75 degrees) in the tilt angle of reflective element 42 is needed to produce the same exit angle of output light 14 from cavity 50 when cavity 50 does not include liquid 52.

Figure 9:
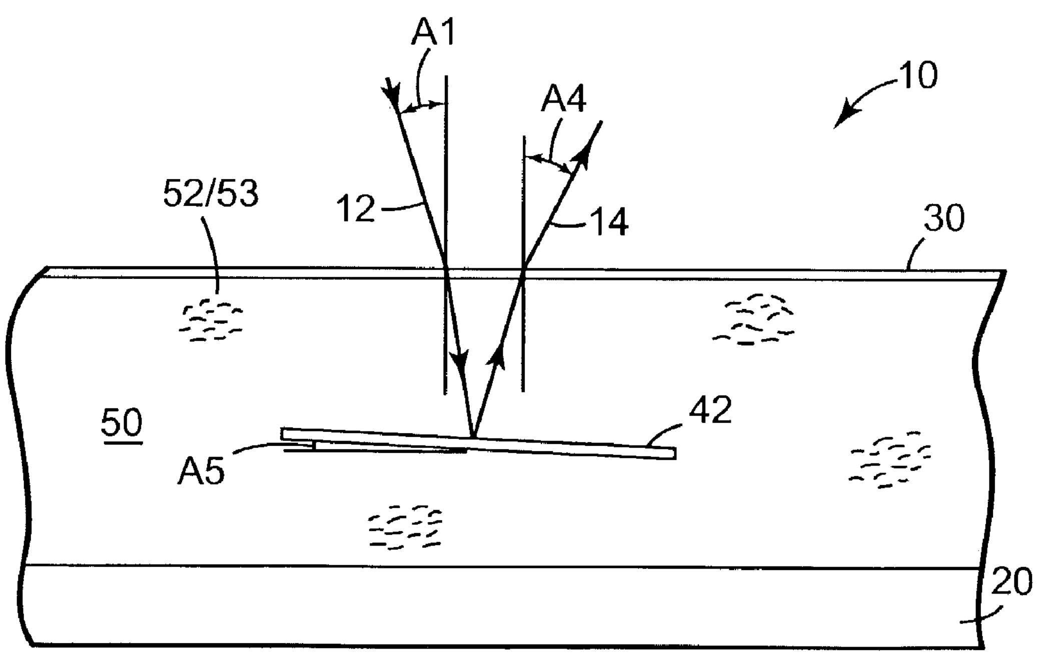
FIG. 9 is a schematic cross-sectional view illustrating another embodiment of light modulation by a micro-mirror device according to the present invention.

FIG. 9 illustrates another exemplary embodiment of modulation of light by a micro-mirror device with a liquid having an index of refraction greater than one disposed within cavity 50. In the exemplary embodiment of FIG. 9, cavity 50 includes liquid 52 (including dielectric liquid 53) having an index of refraction of 1.65. In addition, illumination Angle A1 of input light 12 is 15 degrees. As such, with liquid 52 disposed in cavity 50 and with the same illumination angle (15 degrees) of input light 12, to produce exit angle A4 of output light 14 with the same exit angle (25 degrees) as illustrated in FIG. 6, tilt angle A5 of reflective element 42 need only be 2.9 degrees. Thus, for example, a 42 percent decrease (2.1 degrees) in the tilt angle of reflective element 42 can produce the same exit angle of output light 14 from cavity 50 when cavity 50 includes liquid 52.

Figure 10:
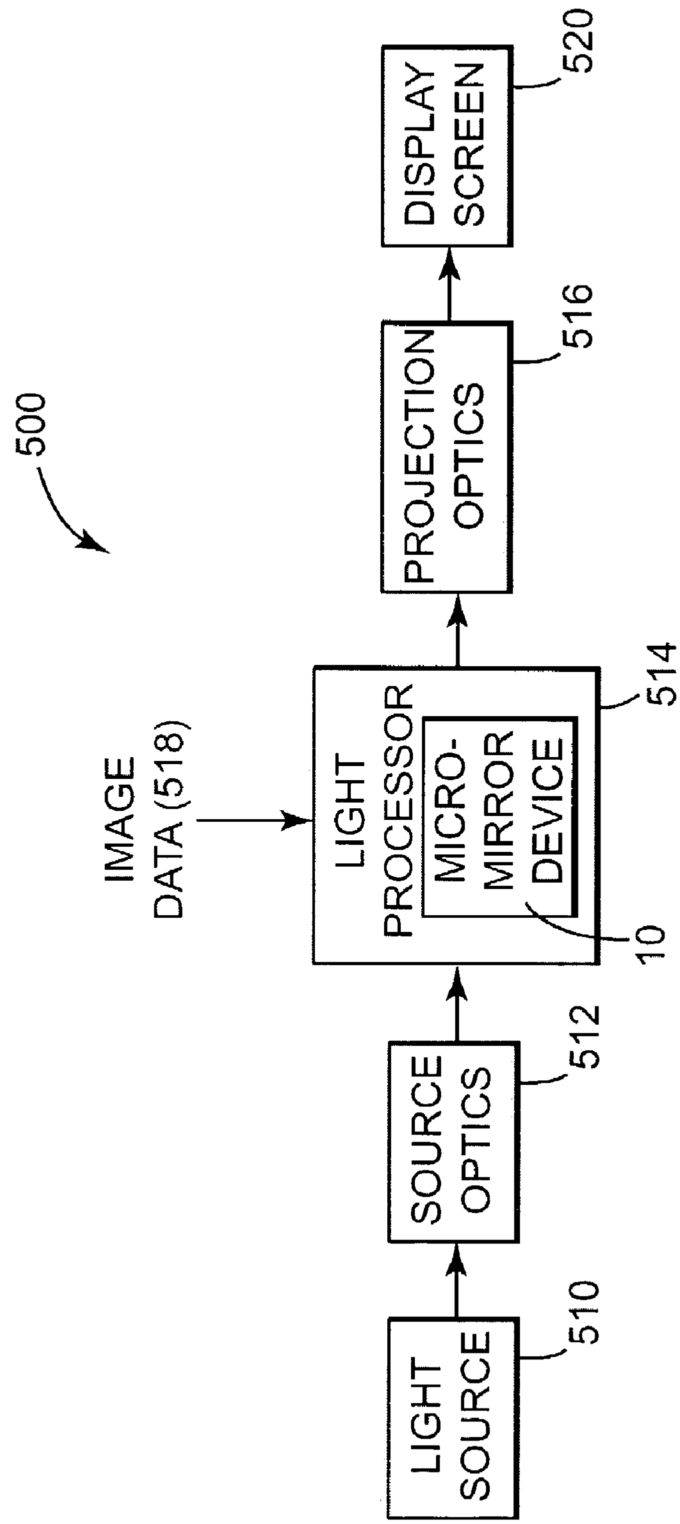
FIG. 10 is a block diagram illustrating one embodiment of a display system including a micro-mirror device according to the present invention.

In one embodiment, as illustrated in FIG. 10, micro-mirror device 10 is incorporated in a display system 500. Display system 500 includes a light source 510, source optics 512, a light processor or controller 514, and projection optics 516. Light processor 514 includes multiple micro-mirror devices 10 arranged in an array such that each micro-mirror device 10 constitutes one cell or pixel of the display. The array of micro-mirror devices 10 may be formed on a common substrate with separate cavities and/or a common cavity for the reflective elements of the multiple micro-mirror devices 10.

In one embodiment, light processor 514 receives image data 518 representing an image to be displayed. As such, light processor 514 controls the actuation of micro-mirror devices 10 and the modulation of light received from light source 510 based on image data 518. The modulated light is then projected to a viewer or onto a display screen 520.

Figure 11:
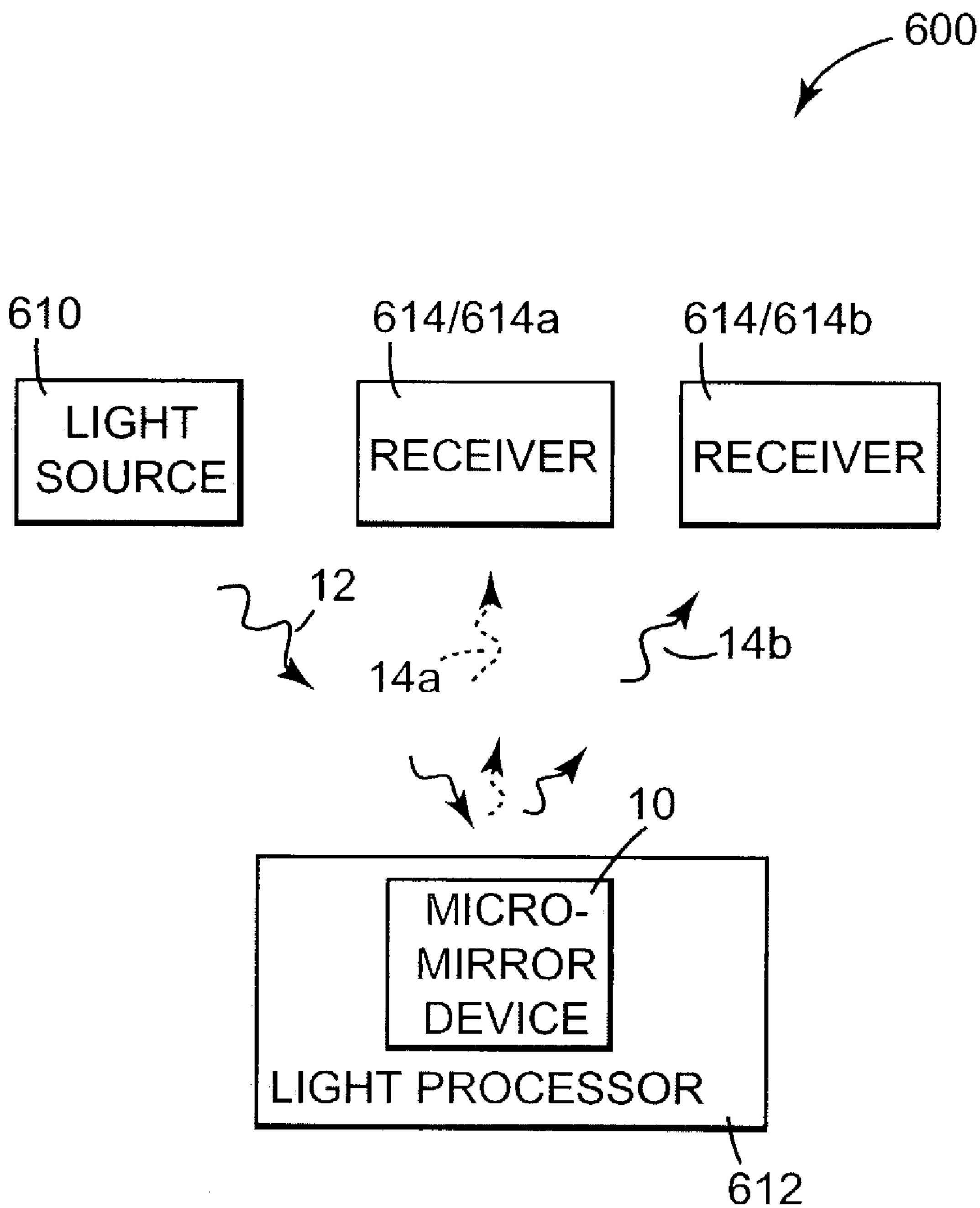
FIG. 11 is a block diagram illustrating one embodiment of an optical switch including a micro-mirror device according to the present invention.

In one embodiment, as illustrated in FIG. 11, micro-mirror device 10 is incorporated in an optical switching system 600. Optical switching system 600 includes a light source 610, a light processor or controller 612, and at least one receiver 614. Light processor 612 includes one or more micro-mirror devices 10 configured to selectively direct light to receiver 614. Light source 610 may include, for example, an optical fiber, laser, light emitting diode (LED), or other light emitting device for producing input light 12. Receiver 614 may include, for example, an optical fiber, light pipe/channel, or other optical receiving or detecting device.

In one embodiment, receiver 614 includes a first receiver 614*a* and a second receiver 614*b*. As such, light processor 612 controls actuation of micro-mirror device 10 and the modulation of light received from light source 610 to direct light to first receiver 614*a* or second receiver 614*b*. For example, when micro-mirror device 10 is in a first position, output light 14*a* is directed to first receiver 614*a* and, when micro-mirror device 10 is in a second position, output light 14*b* is directed to second receiver 614*b*. As such, optical switching system 600 controls or directs light with micro-mirror device 10 for use, for example, in optical addressing or switching.

By disposing liquid 52 (including dielectric liquid 53) having an index of refraction greater than one within cavity 50, an exit angle of output light 14 from micro-mirror device 10 can be increased or amplified without having to increase the tilt angle of reflective element 42. By increasing the exit angle of output light 14 from micro-mirror device 10, incident light can be more effectively modulated between being directed completely on and completely off the projection optics of the display device. As such, a contrast ratio of the display device can be increased.

In addition, by producing a desired exit angle of output light 14 from micro-mirror device 10 with a smaller tilt angle of reflective element 42, the apparent tilt angle of reflective element 42 can be greater than the actual tilt angle of reflective element 42. Thus, faster response or actuation times of micro-mirror device 10 can be achieved since reflective element 42 can be rotated or tilted through a smaller distance while still producing the desired exit angle of output light 14 from micro-mirror device 10. Furthermore, micro-mirror device 10 may be subjected to less fatigue since reflective element 42 can be rotated or tilted through the smaller distance while still producing the desired exit angle of output light 14 from micro-mirror device 10.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A micro-mirror device, comprising:

a substrate having a surface;

a plate spaced from the substrate and oriented substantially parallel to the substrate, the plate having a surface oriented substantially parallel to the surface of the substrate, and the plate and the substrate defining a cavity therebetween;

a reflective element interposed between the substrate and the plate; and a liquid having an index of refraction greater tan one disposed in the cavity between at least the reflective element and the plate, wherein the reflective element is adapted to move between a first position and at least one second position, and reflect light through the surface of the plate.

2. The device of claim 1, wherein the at least one second position is oriented at an angle to the first position.

3. The device of claim 1, wherein the reflective element is adapted to reflect light through the liquid, and the liquid is adapted to increase an exit angle of the light from the cavity for a given tilt angle of the reflective element.

4. The device of claim 1, wherein the reflective element is adapted to reflect light through the liquid, and the liquid is adapted to produce an exit angle of the light from the cavity corresponding to a tilt angle of the reflective element greater than an actual tilt angle of the reflective element.

5. The device of claim 1, wherein the index of refraction of the liquid is in a range of approximately 1.3 to approximately 1.7.

6. The device of claim 1, wherein the liquid includes a dielectric liquid.

7. The device of claim 1, wherein the plate and the liquid are substantially transparent.

8. The device of claim 1, wherein the plate has an index of refraction substantially equal to the index of refraction of the liquid.

9. The device of claim 1, wherein the reflective element is adapted to reflect light through the liquid and the plate, and wherein a thickness of the plate is substantially thin such that refraction at the plate is substantially negligible.

10. The device of claim 1, wherein the reflective element is submerged in the liquid.

11. The device of claim 1, further comprising:

at least one electrode formed on the substrate, wherein the reflective element is adapted to move in response to application of an electrical signal to the at least one electrode.

12. The device of claim 1, further comprising:

at least one post extending from the substrate and supporting the reflective element.

13. The device of claim 12, further comprising:

a conductive via extending through the at least one post and electrically coupled to the reflective element, wherein the reflective element is adapted to move in response to application of an electrical signal to the reflective element through the conductive via.

14. A display device including the micro-mirror device of claim 1.

15. An optical switch including the micro-mirror device of claim 1.

16. A method of forming a micro-mirror device, the method comprising:

providing a substrate having a surface;

orienting a surface of a plate substantially parallel to the surface of the substrate and spacing the plate from the substrate, including defining a cavity between the plate and the substrate;

interposing a reflective element between the substrate and the plate; and disposing a liquid having an index of refraction greater than one in the cavity between at least the reflective element and the plate, wherein the reflective element is adapted to move between a first position and at least one second position, and reflect light through the surface of the plate.

17. The method of claim 16, wherein the at least one second position is oriented at an angle to the first position.

18. The method of claim 16, wherein the reflective element is adapted to reflect light through the liquid and the liquid is adapted to increase an exit angle of the light from the cavity for a given tilt angle of the reflective element.

19. The method of claim 16, wherein the reflective element is adapted to reflect light through the liquid and the liquid is adapted to produce an exit angle of the light from the cavity corresponding to a tilt angle of the reflective element greater than an actual tilt angle of the reflective element.

20. The method of claim 16, wherein the index of refraction of the liquid is in a range of approximately 1.3 to approximately 1.7.

21. The method of claim 16, wherein the liquid includes a dielectric liquid.

22. The method of claim 16, wherein the plate and the liquid are substantial transparent.

23. The method of claim 16, wherein the plate has an index of refraction substantially equal to the index of refraction of the liquid.

24. The method of claim 16, wherein the reflective element is adapted to reflect light through the liquid and the plate, and wherein a thickness of the plate is substantially thin such that refraction at the plate is substantially negligible.

25. The method of claim 16, wherein interposing the reflective element between the substrate and the plate includes submerging the reflective element in the liquid.

26. The method of claim 16, further comprising:

forming at least one electrode on the substrate, wherein the reflective element is adapted to move in response to application of an electrical signal to the at least one electrode.

27. The method of claim 16, further comprising:

extending at least one post from the substrate, wherein interposing the reflective element between the substrate and the plate includes supporting the reflective element from the at least one post.

28. The method of claim 27, further comprising:

extending a conductive via through the at least one post and electrically coupling the conductive via with the reflective element, wherein the reflective element is adapted to move in response to application of an electrical signal to the reflective element through the conductive via.

29. A micro-mirror device, comprising:

a substrate having a surface;

a plate spaced from the substrate and oriented substantially parallel to the substrate, wherein the plate has a surface oriented substantially parallel to the surface of the substrate, and the plate and the substrate define a cavity therebetween;

a reflective element interposed between the substrate and the plate in the cavity, wherein the reflective element is adapted to reflect light from the cavity and through the surface of the plate; and means for amplifying an exit angle of light from the cavity for a given tilt angle of the reflective element.

30. The device of claim 29, further comprising:

means for moving the reflective element between a first position and at least one second position.

31. The device of claim 30, wherein means for moving the reflective element includes means for moving the reflective element through an angle between the first position and the at least one second position.

32. The device of claim 29, wherein means for amplifying the exit angle of light from the cavity includes means for exiting the light from the cavity with the exit angle corresponding to an apparent tilt angle of the reflective element greater than an actual tilt angle of the reflective element.

33. The device of claim 29, wherein means for amplifying the exit angle of light from the cavity includes a liquid having an index of refraction greater than one disposed in the cavity between the reflective element and the plate.

34. The device of claim 33, wherein the index of refraction of the liquid is in a range of approximately 1.3 to approximately 1.7.

35. The device of claim 33, wherein the liquid includes a dielectric liquid.

36. The device of claim 33, wherein the plate has an index of refraction substantially equal to the index of refraction of the liquid.

37. The device of claim 33, wherein the reflective element is adapted to direct the light through the liquid and through an interface with the liquid, wherein the light is adapted to refract at the interface with the liquid.

38. The device of claim 33, wherein the reflective element is adapted to direct the light through the liquid and the plate, wherein the plate is of a thickness such that refraction at the plate is substantially negligible.

39. A method of controlling light with a micro-mirror device including a reflective element interposed between a substrate and a transparent plate, the method comprising:

receiving light at the reflective element through a surface of the transparent plate oriented substantially parallel to a surface of the substrate; and reflecting the light with the reflective element, including directing the light through a liquid having an index of refraction greater than one, through an interface with the liquid, and back through the transparent plate, wherein directing the light through the interface with the liquid includes refracting the light at the interface with the liquid.

40. The method of claim 39, wherein refracting the light at the interface with the liquid includes amplifying an exit angle of the light from the liquid for a given tilt angle of the reflective element.

41. The method of claim 39, wherein refracting the light at the interface with the liquid includes exiting the light from the liquid with an exit angle corresponding to an apparent tilt angle of the reflective element greater than an actual tilt angle of the reflective element.

42. The method of claim 39, wherein the index of refraction of the liquid is in a range of approximately 1.3 to approximately 1.7.

43. The method of claim 39, wherein the liquid includes a dielectric liquid.

44. The method of claim 39, further comprising:

moving the reflective element between a first position and at least one second position oriented at an angle to the first position.

45. The method of claim 44, when moving the reflective element between the first position and the at least one second position includes directing the light in a first direction when the reflective element is in the first position and directing the light in a second direction when the reflective element is in the at least one second position.

46. A method of using a liquid having an index of refraction greater than one in a micro-mirror device including a reflective element interposed between a substrate and a transparent plate, the method comprising:

receiving light at the reflective element through a surface of the transparent plate oriented substantially parallel to a surface of the substrate;

reflecting the light with the reflective element, including directing the light through the liquid, through an interface with the liquid, and back through the transparent plate; and refracting the light at the interface with the liquid, including increasing an exit angle of the light from the micro-mirror device for a given tilt angle of the reflective element.

47. A method of using a liquid having an index of refraction greater than one in a micro-mirror device including a reflective element interposed between a substrate and a transparent plate, the method comprising:

receiving light at the reflective element through a surface of the transparent plate oriented substantially parallel to a surface of the substrate;

reflecting the light with the reflective element, including directing the light through the liquid, through an interface with the liquid, and back through the transparent plate; and refracting the light at the interface with the liquid, including exiting the light from the micro-mirror device with an exit angle corresponding to an apparent tilt angle of the reflective element greater than an actual tilt angle of the reflective element.

48. A method of using a liquid having an index of refraction greater than one in a micro-mirror device including a reflective element interposed between a substrate and a transparent plate, the method comprising:

receiving light at the reflective element through a surface of the transparent plate oriented substantially parallel to a surface of the substrate;

reflecting the light with the reflective element, including directing the light through the liquid, through an interface with the liquid, and back through the transparent plate; and refracting the light at the interface with the liquid, including reducing a tilt angle of the reflective element for a desired exit angle of the light from the micro-mirror device.

49. A method of using a liquid having an index of refraction greater than one in a micro-mirror device including a reflective element, the method comprising:

reflecting light with the reflective element, including directing the light through the liquid and through an interface with the liquid;

moving the reflective element through a tilt angle between a first position and at least one second position; and refracting the light at the interface with the liquid, including reducing the tilt angle of the reflective element for a desired exit angle of the light from the micro-mirror device, wherein reducing the tilt angle of the reflective element for the desired exit angle of the light includes increasing a response time of moving the reflective element between the first position and the at least one second position.

50. A method of using a liquid having an index of refraction greater than one in a micro-mirror device including a reflective element, the method comprising:

reflecting light with the reflective element, including directing the light through the liquid and through an interface with the liquid;

moving the reflective element through a tilt angle between a first position and at least one second position; and reflecting the light at the interface with the liquid, including reducing the tilt angle of the reflective element for a desired exit angle of the light from the micro-mirror device, wherein reducing the tilt angle of the reflective element for the desired exit angle of the light includes reducing fatigue of the micro-mirror device while moving the reflective element between the first position and the at least one second position.

* * * * *

UNITED STATES PATENT AND TRADEMARK OFFICE
CERTIFICATE OF CORRECTION

PATENT NO. : 6,972,882 B2
APPLICATION NO. : 10/387310
DATED : December 6, 2005
INVENTOR(S) : Ring et al.

It is certified that error appears in the above-identified patent and that said Letters Patent is hereby corrected as shown below:

Col. 10 ( line 41), delete "tan" and insert therefor --than--.

Signed and Sealed this

Nineteenth Day of September, 2006

JON W. DUDAS
*Director of the United States Patent and Trademark Office*